United States Patent [19]
Bodway

[11] 3,988,824
[45] Nov. 2, 1976

[54] METHOD FOR MANUFACTURING THIN FILM CIRCUITS

[75] Inventor: George E. Bodway, Los Altos, Calif.

[73] Assignee: Hewlett-Packard Company, Palo Alto, Calif.

[22] Filed: Sept. 17, 1973

[21] Appl. No.: 397,524

Related U.S. Application Data

[63] Continuation of Ser. No. 255,905, May 22, 1972, abandoned, which is a continuation of Ser. No. 56,610, July 20, 1970, abandoned.

[52] U.S. Cl.................................. 29/577; 29/25.42; 29/620; 204/38 A; 317/256; 317/258; 427/80
[51] Int. Cl.²........................................ B01J 17/00
[58] Field of Search................ 29/576, 576 OC, 577, 29/620, 610, 25.41, 25.42; 317/256, 258, 261; 117/217; 204/38 A

[56] References Cited
UNITED STATES PATENTS

| | | | |
|---|---|---|---|
| 3,201,667 | 8/1965 | Varga | 29/25.42 |
| 3,407,465 | 10/1968 | Ortel | 29/25.42 |
| 3,483,451 | 12/1969 | Klerer | 317/261 |
| 3,537,891 | 11/1970 | Rairden | 117/201 |
| 3,553,545 | 1/1971 | Gerstenberg | 317/261 |
| 3,570,114 | 3/1971 | Bean | 29/577 |

*Primary Examiner*—W. Tupman
*Attorney, Agent, or Firm*—Roland I. Griffin

[57] ABSTRACT

A thin film capacitor and resistor is disclosed, each capacitor being formed by a structure including a metallic film on an insulating substrate, the metallic film having an oxidized surface formed by anodizing, an oxide layer on the oxidized surface of the metallic film, and a pair of spaced-apart conductor layers over the oxide layer, each resistor being formed by a resistive film on the substrate and a pair of spaced-apart conductor layers connecting with the ends of the resistive film. In the manufacture of the circuit, a predeposited substrate is produced that may be utilized by circuit designers in the subsequent fabrication of custom microcircuits. A heat treating technique is employed in trimming the resistors of the circuit.

13 Claims, 7 Drawing Figures

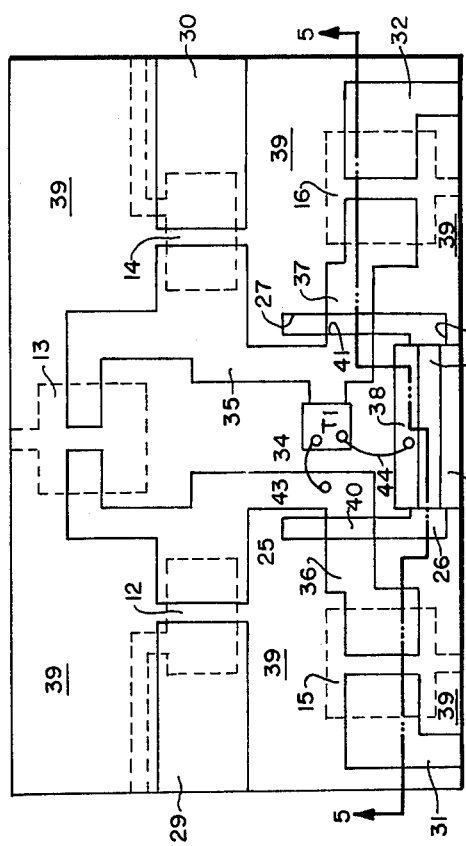
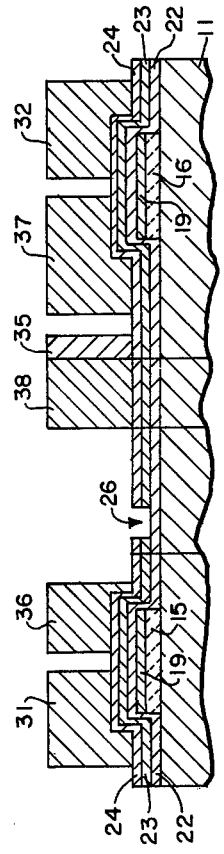
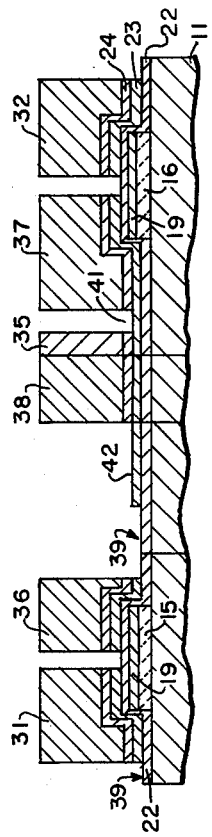
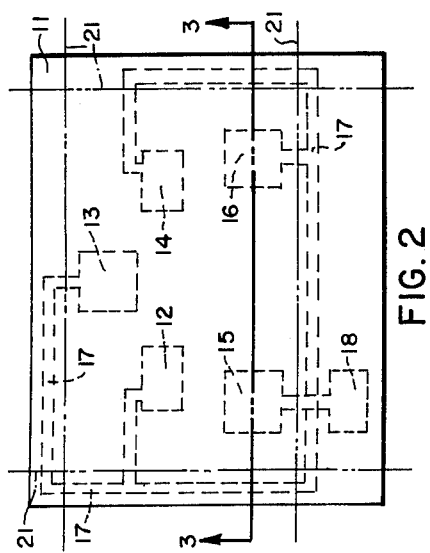
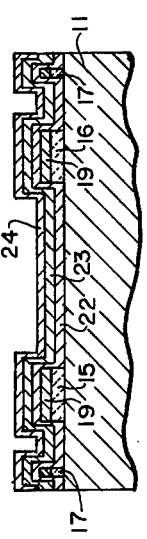
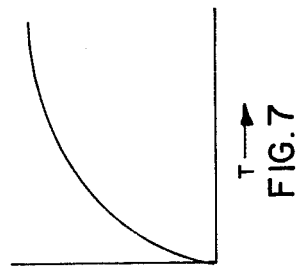
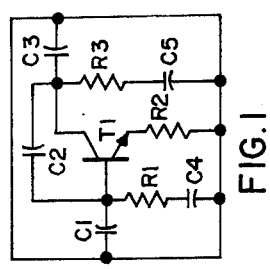

METHOD FOR MANUFACTURING THIN FILM CIRCUITS

This is a continuation of U.S. Pat. application Ser. No. 255,905 filed May 22, 1972, now abandoned and which is in turn a continuation of U.S. Pat. application Ser. No. 56,610 filed July 20, 1970, now abandoned.

BACKGROUND OF THE INVENTION

The fabrication of electronic circuitry wherein resistors and capacitors and their interconnections are formed by thin-film techniques is growing rapidly in importance. With thin-film technology, complex circuits having precision capacitors and resistors may be tailored to meet specific circuit design requirements, resulting in microcircuitry of reduced size, weight, and cost and increased reliability. One form of thin-film circuit, along with the method of manufacture, is disclosed in U.S. Pat. application Ser. No. 775,828 filed on Nov. 14, 1968, by George E. Bodway issued on Oct. 26, 1971, as U.S. Pat. No. 3,616,282 entitled METHOD OF PRODUCING THIN FILM CIRCUIT ELEMENTS, and assigned to the same assignee as the present patent application.

One typical process for the manufacture of thin film resistor-capacitor circuits of the type shown in U.S. Pat. No. 3,616,282 comprises the following steps, performed sequentially:

1. Forming the under-electrodes of the various capacitors on an insulating substrate by
   a. sputtering a layer of conductive metal such as tantalum (Ta) over the surface of the substrate,
   b. forming a mask on the metal layer by a known photo-resist technique, and
   c. etching through the mask to remove all the metal except for the desired capacitor under electrodes and interconnections therebetween that serve to provide a single common electrical path for all the capacitor under electrodes during a subsequent anodizing step;

2. Forming a dielectric layer over a portion of the surface of each of the capacitor under electrodes by
   a. depositing an oxide layer over the entire surface of the substrate, capacitor under electrodes, and interconnections, such as for example, by a silicon dioxide ($SiO_2$) deposition,
   b. forming a mask on the oxide layer by the photoresist technique,
   c. etching through the mask to remove the oxide layer from areas of the capacitor under-electrodes to be anodized,
   d. electrochemically anodizing the exposed portions of the capacitor under-electrodes in an appropriate electrolyte for an appropriate period of time to form the desired dielectric layer (for example, $Ta_2O_5$) of each capacitor under-electrode, and
   e. removing the anodizing mask by an oxide etch, leaving the partially anodized under-electrodes and the interconnections therebetween;

3. Removing the interconnections between the capacitor under-electrodes by
   a. forming a mask by the photoresist technique leaving the interconnections exposed, and
   b. etching away the interconnections;

4. Forming the various resistors on the substrate by
   a. sputtering a layer of resistive material such as ($Ta_2N$) over the entire surface of the substrate and capacitor electrodes,
   b. depositing a first layer of conductive material such as chrome gold (CrAu), which adheres well to the resistive layer, over the resistive layer,
   c. forming a mask, which covers those areas of the structure where the resistors are to remain, by the photoresist technique, and
   d. etching away the exposed first conductive layer and the underlying resistive layer, leaving the desired resistors;

5. In order to increase the yield of these circuits, depositing an additional oxide layer on the dielectric ($Ta_2O_5$) layer of each capacitor under-electrode to cure pinholes therein and other imperfections produced therein during the various fabrication steps performed after the anodizing step, such as during the oxide etching step of 2(e) above and the resistive-layer sputtering step of 4(a) above, (this step is performed for example by depositing a layer of silicon dioxide ($SiO_2$) for example over the structure with a value of .055 $pf/mil^2 \pm 5\%$ for the combined $Ta_2O_5$ and $SiO_2$ layers).

6. Forming the upper-electrodes of various capacitors by
   a. depositing a second layer of conductive material such as chrome gold (CrAu) over the entire surface of the structure,
   b. forming a mask, which covers those areas of the structure where the capacitor upper-electrodes and the underlying additional oxide layer are to remain, by the photoresist technique, and
   c. etching away the exposed second conductive layer and then the underlying additional oxide layer, leaving the desired capacitor upper-electrodes;

7. Completing the upper-electrodes of the various capacitors and forming the interconnections between the various capacitors and resistors by
   a. depositing a third layer of conductive material such as chrome gold (CrAu) over the entire surface of the structure,
   b. forming a mask on the third conductive layer by the photoresist technique to define the capacitor upper-electrodes and interconnections,
   c. plating a thick layer (0.30–0.40 mils) of gold to form the interconnections, and
   d. etching away the second and then the third conductive layers where not covered by the thick gold interconnections.

It is noted that, in the above process, certain difficult steps are performed. For example, the masking and anodizing steps of 2(b), (c), and (d) above are troublesome since, during anodizing, the mask has to withstand 200 volts in an electrolytic bath, and the mask oftentimes breaks down.

Other difficult steps in the process are the interconnection masking and etching steps of 3(a) and (b) above. Still other difficult steps in the process are the making and etching steps of 6(b) and (c), particularly since the mask formed must be pinhole free to prevent pinholes from being etched in the capacitor dielectric layers. The etching step of 6(c) requires the use of a silicon dioxide in forming the additional oxide layer, since it is difficult or impossible to etch other forms of oxide layers, and only silicon dioxide has been found to be satisfactory.

Since a photoresist mask alone is not capable of withstanding the oxide etch needed to form the capacitors in the etching step of 6(c) the layer of CrAu deposited during the step of 6(a) is needed to serve as a mask, and thus the two layers of CrAu deposited during the steps of 6(a) and 7(a) and the two subsequent CrAu etching steps of 6(c) and 7(d) are needed.

Also, where silicon oxide layers are selectively etched and remaining portions thereof are subsequently gold plated through a masking, there is a tendency for an undesirable gold bead to form around the upper edges of the masked portions of the oxide layers, the mask being unable to adequately protect these edges.

Because of the high temperatures involved in the SiO₂ deposition step of 5 above, it is necessary that the first layer of CrAu deposited in the step of 4(b) above be fairly thick, so as not to be deleteriously affected by diffusion of chrome therefrom due to the heat. Consequently, the etching step of 4(d) above is lengthened resulting in less than optimum resistor definition.

The above process requires seven masking steps, and the trips between the photoresist masking stages and the subsequent deposition and etching stages result in an overall fabrication period of approximately 3 weeks.

SUMMARY OF THE INVENTION

The principal object of the present invention is to provide a novel thin film resistor-capacitor network structure and method for fabricating the structure resulting in very high manufacturing yield.

Each capacitor is formed by fabricating two capacitance elements in series, with a metal under-elctrode serving as the junction between the two series capacitance elements, and with two external connections to the capacitor being formed over the dielectric layer of the capacitor. In this manner, a number of troublesome steps in the prior fabrication process are avoided.

Since no external connections are to be made with the capacitor under-electrodes, the total surface area of the capacitor under-electrodes is anodized, and no anodizing mask is needed, eliminating the mask breakdown problem mentioned above. After anodizing, the complete surface of the substrate and capacitor under-electrodes is coated with a layer of oxide which, along with the anodized region of each capacitor under-electrode serves as the dielectric for each capacitor. This oxide layer is followed by a layer of resistive material which serves to form the resistors, and then by a layer of conductive material. The resistors and capacitors may thereafter be formed on this substrate by straightforward masking, etching, and conductor deposition steps set forth in detail below.

In this novel structure, the capacitor under-electrodes are positioned peripherally around the substrate surface, and the interconnections between these electrodes are all formed near the outer edges of the substrate. Thus, after the electrode anodizing step in the fabrication of the structure, the interconnections may be removed by sawing off the edge areas of the wafer. This eliminates the need for the interconnection mask and etching steps of 3(a) and (b) above.

Since the two external connections to each capacitor are made on the top surface thereof, and since there is no need to make an exteral connection to the capacitor under-electrodes, the entire surface area of each capacitor under-electrode may be anodized and then covered by the oxide layer to form the di-electric layers of each capacitor without etching. Thus, the difficult oxide etching step of 6(c) above, as well as the formation of the pinhole-free mask in the step of 6(b), above, are eliminated, resulting in a pinhole-free oxide layer.

Elimination of the need for this oxide etching step permits the use of a wider range of oxides for the dielectric layer, with their possible advantageous dielectric characteristics, including oxides which cannot be etched.

Only one CrAu layer is needed rather than two or more as in the previous process, and, as a result, only one CrAu etch is used. In addition, the CrAu layer need not be thick, since it is not subsequently subjected to the heat of an SiO₂ deposition, and thus resistor geometry may be optimized.

This new fabrication technique employs more than one-third fewer process steps, including three less masking steps. There are only three trips between the photoresist masking stages and the subsequent deposition and etching stages rather than six trips as in the prior process, and the total fabrication time has been cut from 3 weeks to 1 week. The capacitor yield of the improved structures has been increased to nearly 100%.

This improved technique therefore makes it economical to use thin film resistor-capacitor structures even when an integrated circuit uses only two or three capacitors.

The new fabrication technique leads to a general purpose predeposited substrate structure that may then be distributed to circuit designers for their individual use in creating new circuits. This predeposited substrate structure comprises a plurality of anodized capacitor under-electrodes spaced around the periphery of the substrate (the interconnections used for anodizing are sawed off). The oxide dielectric layer for the capacitors, the layer of resistive material, and the thin conductor layer of chrome gold are all included on the standard structure given to the circuit designer. These early fabrication stages involve the most expensive manufacturing equipment, generally not available to circuit designers. However, the equipment needed to perform the remaining steps in the formation of a capacitor-resistor network is available to most circuit designers, permitting them to design and manufacture many diverse forms of circuits from the standard substrate structure.

DESCRIPTION OF THE DRAWINGS

FIG. 1 is a schematic diagram of a thin film resistor and capacitor structure made in accordance with the preferred embodiment of the present invention.

FIG. 2 is a top view of the thin film structure of FIG. 1 in an early stage of its fabrication.

FIG. 3 is a cross-sectional side view of the thin film structure of FIG. 2 taken along section line 3—3 therein.

FIG. 4 is a top view of the thin film structure of FIG. 1 in an advanced stage of its fabrication.

FIG. 5 is a cross-sectional side view of the thin film structure of FIG. 4 taken along section line 5—5 therein.

FIG. 6 is a similar cross-sectional side view of the thin film structure of FIG. 4 in a still later stage of fabrication.

FIG. 7 is a curve illustrating the relationship between resistance value and heat treatment time for the resistors formed in the thin film structure of FIG. 1.

DESCRIPTION OF THE PREFERRED EMBODIMENTS

In order to more clearly describe the present invention, the step-by-step construction of a simple amplifier circuit shown in FIG. 1 will be described in detail. This simple circuit comprises a transistor T1 coupled to a thin film resistor-capacitor structure comprising three resistors R1, R2, and R3 and five capacitors C1 through C5.

Referring now to FIGS. 2 and 3, the main body or support for the structure comprises a substrate 11 of good insulating material, such as sapphire, glass or ceramic, and of a suitable size, such as ½ inch wide, 1 inch long, and 25 mils thick. After proper cleaning, the upper surface of the substrate is deposited with a layer of good electrical conducting material on which a dielectric oxide layer may be anodically formed. This layer is preferably beta tantalum or hafnium of suitable thickness, for example 7,000 to 9,000 A. Other suitable materials include aluminum, niobium, titanium and zirconium. This layer may be deposited by a number of suitable processes including cathodic sputtering and vacuum deposition.

The metallic layer deposited on substrate 11 is masked by a known photoresist technique and then etched to produce a plurality of metallic electrodes 12–16, which are to serve as the under-electrodes of the capacitors C1 through C5, respectively. These electrodes may be formed by techniques other than the photoresist masking technique. For example, ion beam machining may be employed. At the time these electrodes are formed, interconnecting strips 17 and a common metallic pad 18 are also formed, the pad 18 and the interconnecting strips 17 forming a common electrical connection for the electrodes during the subsequent anodizing process.

A layer of good dielectric material is then formed on the entire surface area of each electrode by anodizing the metallic electrodes in an appropriate electrolyte, such as about 0.01% solution of citric acid at about 200 volts for 1 hour, resulting in the formation of an oxide layer 19 on the upper surface of each electrode. In the case of a tantalum electrode, a layer of tantalum pentoxide ($Ta_2O_5$) is formed, and in the case of a hafnium electrode, a layer of hafnium oxide ($HfO_2$) is formed. This layer is on the order of several thousand Angstrom units thick. Once the anodizing has been completed, the pad 18 and the interconnecting strips 17 for the electrodes 12–16 may be eliminated from the structure by sawing the substrate 11 along the lines 21 shown in FIG. 2. This sewing step may be postponed until after the structure has been completely fabricated, if desired.

An oxide layer 22 is then formed over the entire surface of the substrate 11 and the anodized electrodes 12–16. For example, silicon dioxide ($SiO_2$) may be sputtered onto the surface to a selected thickness, (for example, 2500 A) to give the desired capacitance density. Silicon dioxide will give a capacitance density of 0.055 pf/mil$^2$. The thickness of the silicon dioxide layer may be accurately controlled within ± 2%, and, thus, the value of the capacitors formed may be very accurately controlled. Since, in this invention, it is not necessary to etch the oxide 22 during subsequent steps in the process, many oxides can be selected, for example, hafnium dioxide, silicon nitride, aluminum oxide, yttrium oxide and tantalum pentoxide, to give different dielectric constants and different capacitance densities ranging from 0.05 to 0.55 pf/mil$^2$. The oxide layer 22 will generally have a thickness in the range from the order of 2000 A to 10,000 A. The oxide layer 22 is preferably formed by sputtering, but may be applied by other techniques, such as gaseous deposition and electron beam deposition.

A layer 23 of good resistive material is then applied over the oxide layer 22, for example, an 800 A thick layer of tantalum nitride ($Ta_2N$) applied by reactive sputtering. Other resistive materials, such as nichrome, hafnium nitride, and rhenium, may be selected for use, and may be applied by suitable techniques, including sputtering and evaporation. As is well known, the thickness of the resistive layer 23 will vary depending on the value of the ohms per square desired. Generally the thickness will range from 200 A to several thousand A. Typically, a 30 or 50 ohms/square resistive layers 23 is utilized. The sheet resistivity is established at a lower value than the desired ultimate value, the end value being produced by trimming the resistors as described below. The nominal resistivity range for the a 30 ohms/square layer is, for example 24.0 – 26.5 and that for the 50 layer is 39.0 – 42.0.

An electrically conducting metal layer 24, preferably of chrome gold (CrAu), is then applied by any suitable technique, such as sputtering or evaporation. The metal layer 24 may also be formed of moly gold, nickel gold, or copper and may be formed to a suitable thickness (for example, several thousand Angstrom units) giving about 0.1 ohm per square.

At this stage in the fabrication, a form of standard, general purpose predeposited substrate structure has been fabricated. In our example, only five capacitor under-electrodes have been provided, but a much larger number are fabricated on the general purpose substrate, the electrodes being of various area sizes and ranging around the periphery of the substrate. The large central portion of the substrate is available for creating the various resistors and the circuit interconnections, as well as providing room for bonding transistors to the structure. Any desired ones of the various capacitor under-electrodes may be used in the subsequent circuit fabrication.

These general purpose structures are given to circuit designers for their use in creating innumerable circuits. Since the process apparatus necessary to perform the remaining steps in the fabrication of each circuits is generally available to circuit designers, custom design is greatly facilitated.

The next operation in the fabrication of the illustrative structure of FIG. 1 is to define the width of the resistor elements by a photoresist masking and an etch of both the CrAu layer 24 and the $Ta_2N$ resistive layer 23 down to the surface of the $SiO_2$ layer 22 to form openings 25, 26, 27, and 28 (see FIGS. 4 and 5). Openings 25 and 26 define the width of resistor R1 therebetween; openings 27 and 28 define the width of resistor R3 therebetween; and openings 26 and 28 define the width of resistor R2 therebetween.

As is well known, the value of resistance R of the resistors, given a particular shoot resistivity, is determined by the length L and the width W thereof, where $R \propto L/W$. For high resistance, the resistor is long and narrow, generally taking a sinuous shape. In our illustration, the resistors are of relatively small value and are therefore shorter in length than width.

As a next stage of fabrication, the upper electrodes of the capacitors, the desired interconnections between the circuit elements, and the external connection pads are then plated through a suitable mask onto the CrAu layer 24. A conductive material, such as gold or copper, is used and deposited to a desired thickness (for example, one-fourth mil). As seen in FIG. 4, conductors 29, 30, 31, and 32 serve as external connectors for the capacitors C1, C3, C4, and C5, respectively; conductor 33 serves as the external connector for resistor R2; conductor 34 interconnects one side of capacitor C2 with capacitor C1 and resistor R1; conductor 35 interconnects the other side of capacitor C2 with capacitor C3 and resistor R3; conductor 36 interconnects capacitor C4 and resistor R1; conductor 37 interconnects capacitor C5 and resistor R3; and conductor 38 serves as the connector between resistor R2 and the transistor T1 to be thereafter bounded to the structure.

The value of each capacitor is established by the extent of the two regions sandwiched directly between the two upper-electrodes and the under-electrode, for example, in the case of capacitor C1, the region directly between the under-electrode 12 and the two upper-electrodes 29 and 34. The overlaid area of under-electrode 13 of capacitor C2 is smaller than that for the other capacitors, and the capacitance of capacitor C2 is therefore substantially smaller than that of the other four capacitors. Each capacitor is formed, in effect, by two capacitors connected in series. For example, capacitor C1 is formed by the capacitance between upper-electrode 29 and upper-electrode 12 plus the capacitance between upper-electrode 34 and under-12. The electrical connections to this capacitor are both made to the upper electrodes 29 and 34, and no external connection are made with the under-electrode 12.

As mentioned above, the resistors of this circuit are low in value and, therefore, the length of the resistors is short. Resistor R2 is smaller in value than resistors R1 and R3 and is therefore wider.

As a next stage of fabrication, the CrAu layer 24 and then the resistive Ta$_2$N layer 23 are removed from areas 39 between and around the circuit elements by employing photoresist and etching techniques. Thereafter, the layer 24 of CrAu is removed, by etching, from the areas 40, 41, and 42, leaving the layer of resistive material (Ta$_2$N) to form the resistors R1, R3, and R2, respectively, in these areas (see FIG. 6).

The resistors are now stabilized by placing the substrate in an oven at 425° ±3° C for a suitable period of time (for example, 10 min. ±10 sec.)

As mentioned above, the sheet resistivity of the resistors was made lower than the desired ultimate value. The resistors are now brought up to final value by trimming. In one known method for raising the resistor value, an electrolyte is spread over the resistors, and they are then trim anodized to raise them to within the lower and upper permissible limits.

A resistor trimming technique, eliminating the need for anodizing, is utilized in this invention. The sheet resistivity may be raised by heat treating the resistors. For a given starting resistance, the resistors will increase in value proportionally to the length of time of the heat treatment. A typical curve illustrating the relationship between resistance R and heat treatment time T is shown in FIG. 7. As shown by this curve, the resistance rises in a linear fashion during the earlier stage of the heat and tends to level off later in the heat treatment. For any particular resistor, the starting resistance may be measured and, from the curve of FIG. 7, the heating time necessary to raise the resistor value to within acceptable limits may be determined. The time range for each resistor on the substrate may be determined, and a common time length needed to bring all the resistors within range may be selected For example, the length of the heat treatment time which will first bring one of the plurality of resistors to its maximum allowable resistance value is determined. This will be the maximum allowable time for trimming all the resistors. The length of heat treatment time needed to bring the last one of the resistors just over its minimum allowable resistance value is determined. This will be the minimum allowable time for the trimming. The proper heat treatment time will lie between these two limits. By using the formula of the trimming curve, and supplying the starting resistor values, all the computations necessary to determine a desired heat treatment time may be performed by a computer, significantly decreasing the fabrication time for these networks.

As an example, the oven is heated to 425° C ±3° C and the substrate, or substrates if more than one is being trimmed, is treated for from 10 minutes to 60 minutes, depending on the computed treatment time for the particular one or more substrates.

After final test of the circuit, the transistor T may be bonded to the interconnect 35 so that the collector electrode is coupled to the junction of C2, C3, and R3. Electrical lead 43 is added to connect the base electrode to interconnect 34 between capacitors C1 and C2 and resistor R1 while electrical lead 44 is added to connect the emitter electrode with interconnect 38 to the resistor R2.

I claim:

1. A method for manufacturing a structure from which thin film capacitors and resistors and interconnections therefor may be formed, said method comprising the steps of forming a plurality of metallic film elements on an upper surface of a substrate, forming an oxidized upper surface on each of the metallic film elements, forming a dielectric layer of the upper surface of the substrate and the oxidized upper surface of each of the metalic film elements, forming a layer of resistive material over the dielectric layer, and forming a layer of conductive material over the layer of resistive material.

2. A method as in claim 1 wherein the metallic film elements are tantalum film elements each having a tantalum pentoxide upper surface and wherein the resistive material is tantalum nitride.

3. A method as in claim 1 wherein the metallic film elements are hafnium film elements each having a hafnium oxide upper surface and wherein the resistive material is tantalum nitride.

4. A method as in claim 1 wherein the step of forming an oxidized upper surface on each of the metallic film elements comprises forming a common interconnect circuit for electrically interconnecting the metallic film elements so that they may be simultaneously electrochemically anodized, electrochemically anodizing the upper surface of each of the metallic film elements, and thereafter disconnecting the interconnect circuit from the metallic film elements.

5. A method as in claim 4 wherein the interconnect circuit is formed between the metallic film elements and a peripheral portion of the substrate and wherein the peripheral portion of the substrate is severed from the substrate to disconnect the interconnect circuit from the metallic film elements.

6. A method of manufacturing an integrated circuit structure including interconnected thin film capacitors and resistors, said method comprising the steps of a plurality of metallic film elements on an upper surface of a substrate, forming an oxidized upper surface on each of the metallic film elements, forming a dielectric layer over the upper surface of the substrate and the oxidized upper surface of each of the metallic film elements, forming a layer of resistive material over the dielectric layer, forming a first layer of conductive material over the layer of resistive material, removing portions of both the first layer of conductive material and the layer of resistive material to define a dimension of each of the resistors, forming connections of conductive material on the first layer of conductive material to define desired electrical connections for the capacitors and resistors, removing portions of both the first layer of conductive material and the layer of resistive material to expose the underlying dielectric layer and form the capacitors and the desired electrical connections for the capacitors and resistors, and removing portions of the first conductive layer to expose the underlying layer of resistive material and form the resistors.

7. A method as in claim 6 wherein the step of forming an oxidized upper surface on each of the metallic film elements comprises anodizing the metallic film elements.

8. A method as in claim 7 wherein the metallic film elements are tantalum film elements each having a tantalum pentoxide upper surface.

9. A method in claim 8 wherein the resistive material is tantalum nitride.

10. A method as in claim 9 wherein the dielectric layer is silicon oxide.

11. A method as in claim 9 wherein the dielectric layer is silicon dioxide.

12. A method as in claim 6 wherein the step of forming an oxidized upper surface on each of the metallic film elements comprises forming a common interconnect circuit for electrically interconnecting the metallic film elements so that they may be simultaneously electrochemically anodized, electrochemically anodizing the upper surface of each of the metallic film elements, and thereafter disconnecting the interconnect circuit from the metallic film elements.

13. A method as in claim 12 wherein the interconnect circuit is formed between the metallic film elements and a peripheral portion of the substrate and wherein the peripheral portion of the substrate is severed from the substrate to disconnect the interconnect circuit from the metallic film elements.

* * * * *

UNITED STATES PATENT AND TRADEMARK OFFICE
CERTIFICATE OF CORRECTION

PATENT NO. : 3,988,824
DATED : November 2, 1976
INVENTOR(S) : George E. Bodway

Page 1 of 4

It is certified that error appears in the above-identified patent and that said Letters Patent are hereby corrected as shown below:

In the Abstract, line 1, "resistor is" should read --resistor circuit is--;

Column 1, line 36, "under electrodes" should read --under-electrodes--;

Column 1, line 39, "under electrodes" should read --under-electrodes--;

Column 1, line 42, "under electrodes" should read --under-electrodes--;

Column 1, line 44, "under electrodes" should read --under-electrodes--;

Column 1, lines 66-67, "as ($Ta_2N$)" should read --as tantalum nitride ($Ta_2N$)--;

Column 2, lines 17-18, "performed for example by" should read --performed, for example, by--;

Column 2, line 19, delete the words "for example";

Column 2, line 22, "of various" should read --of the various--;

Column 2, line 57, "making" should read --masking--;

Column 2, line 67, "6(c) the" should read --6(c), the--;

UNITED STATES PATENT OFFICE
CERTIFICATE OF CORRECTION

Patent No. 3,988,824          Dated November 2, 1976

Inventor(s) George E. Bodway          Page 2 of 4

It is certified that error appears in the above-identified patent and that said Letters Patent are hereby corrected as shown below:

Column 3, line 60, "thereof," should read --thereof--;

Column 3, line 67, "6(b)," should read --6(b)--;

Column 4, line 64, "of fabrica-" should read --of its fabrica- --;

Column 5, line 65, "oxide 22" should read -- oxide layer 22--

Column 6, line 18, "layers 23" should read --layer 23--;

Column 6, line 22, "for the a" should read --for a--;

Column 6, line 23, "24.0-26.5 and" should read --24.0-26.5 ohms/square and--;

Column 6, line 24, "50 layer" should read --50 ohms/square layer--;

Column 6, line 24, after the words "39.0-42.0" insert --$\Omega$/sq.--

UNITED STATES PATENT OFFICE
CERTIFICATE OF CORRECTION

Patent No. 3,988,824            Dated November 2, 1976

Inventor(s) George E. Bodway          Page 3 of 4

It is certified that error appears in the above-identified patent and that said Letters Patent are hereby corrected as shown below:

Column 6, line 49, "of each circuits" should read -- of such circuits --.

Column 6, line 63, "particular shoot resistivity" should read -- particular sheet resistivity --;

Column 7, line 18, "thereafter bounded" should read -- area of upper-electrode 13 --.

Column 7, lines 24-25, "area of under-electrode 13" should read --area of upper-electrode 13--;

Column 7, line 31, "upper-electrode" should read --under-electrode--;

Column 7, line 34, "upper electrodes" should read --upper-electrodes--;

Column 7, line 35, "connection are" should read --connections are--;

Column 7, lines 42-43, "from areas 39" should read --from all areas 39--;

Column 7, line 43, "the circuit" should read --the various circuit--;

UNITED STATES PATENT OFFICE
CERTIFICATE OF CORRECTION

Patent No. 3,988,824    Dated November 2, 1976

Inventor(s) George E. Bodway    Page 4 of 4

It is certified that error appears in the above-identified patent and that said Letters Patent are hereby corrected as shown below:

Column 7, line 68, "heat and tends" should read --heat treatment and tends--;

Column 8, line 42, "layer of the" should read --layer over the--; and

Column 9, line 5, "of a" should read --of forming a--.

Signed and Sealed this

Tenth Day of May 1977

[SEAL]

Attest:

RUTH C. MASON
Attesting Officer

C. MARSHALL DANN
Commissioner of Patents and Trademarks